United States Patent
Xin et al.

(10) Patent No.: US 7,585,545 B2
(45) Date of Patent: Sep. 8, 2009

(54) HYDROGEN SULFIDE INJECTION METHOD FOR PHOSPHOR DEPOSITION

(75) Inventors: Yongbao Xin, Mississauga (CA); Joe Acchione, Caledon (CA); Terry Hunt, Acton (CA)

(73) Assignee: Ifire IP Corporation, Fort Saskatchewan, Alberta (CA)

( * ) Notice: Subject to any disclaimer, the term of this patent is extended or adjusted under 35 U.S.C. 154(b) by 255 days.

(21) Appl. No.: 10/878,221

(22) Filed: Jun. 28, 2004

(65) Prior Publication Data
US 2005/0025887 A1  Feb. 3, 2005

Related U.S. Application Data

(60) Provisional application No. 60/484,290, filed on Jul. 3, 2003.

(51) Int. Cl.
*C23C 16/00* (2006.01)
(52) U.S. Cl. .............. 427/248.1; 427/255.23; 427/255.29; 427/255.28; 427/255.7
(58) Field of Classification Search ............... None
See application file for complete search history.

(56) References Cited

U.S. PATENT DOCUMENTS

| | | | |
|---|---|---|---|
| 3,361,591 A * | 1/1968 | Dill et al. | 438/478 |
| 3,767,459 A | 10/1973 | Kingsley et al. | |
| 4,572,842 A | 2/1986 | Dietrich et al. | |
| 4,804,558 A | 2/1989 | Saitoh et al. | |
| 4,931,158 A | 6/1990 | Bunshah et al. | |
| 5,415,756 A | 5/1995 | Wolfe et al. | |
| 5,834,053 A | 11/1998 | Dye et al. | |
| 5,942,089 A | 8/1999 | Sproul et al. | |
| 6,004,618 A | 12/1999 | Mizutani et al. | |
| 6,447,654 B1 * | 9/2002 | Kosyachkov | 204/192.15 |
| 2002/0081371 A1 * | 6/2002 | Cheong | 427/8 |
| 2003/0049384 A1 | 3/2003 | Liu | |

FOREIGN PATENT DOCUMENTS

| | | | |
|---|---|---|---|
| EP | 0 667 383 A2 * | 8/1995 | |
| JP | 05078823 A * | 3/1993 | |
| JP | 06151057 A * | 5/1994 | |
| WO | WO 02/23957 A1 * | 3/2002 | |
| WO | WO 02/051960 A1 * | 7/2002 | |

* cited by examiner

*Primary Examiner*—Timothy Meeks
*Assistant Examiner*—Kelly M Gambetta
(74) *Attorney, Agent, or Firm*—Fay Sharpe LLP

(57) ABSTRACT

The invention is a method of vacuum evaporation of a multi-element sulfur bearing thin film compositions onto a substrate. The method comprises targeting a source of gas or vapour sulfur species at one or more source materials that make up at least part of the thin film composition during evaporation of the source materials. The sulfur species is heated to a high temperature as it reaches the one or more source materials and there is a chemical interaction of the sulfur species with evaporant from the one or more source materials during deposition of said thin film composition. The method is particularly useful for the deposition of phosphors for full colour ac electroluminescent displays employing thick film dielectric layers with a high dielectric constant.

31 Claims, 5 Drawing Sheets

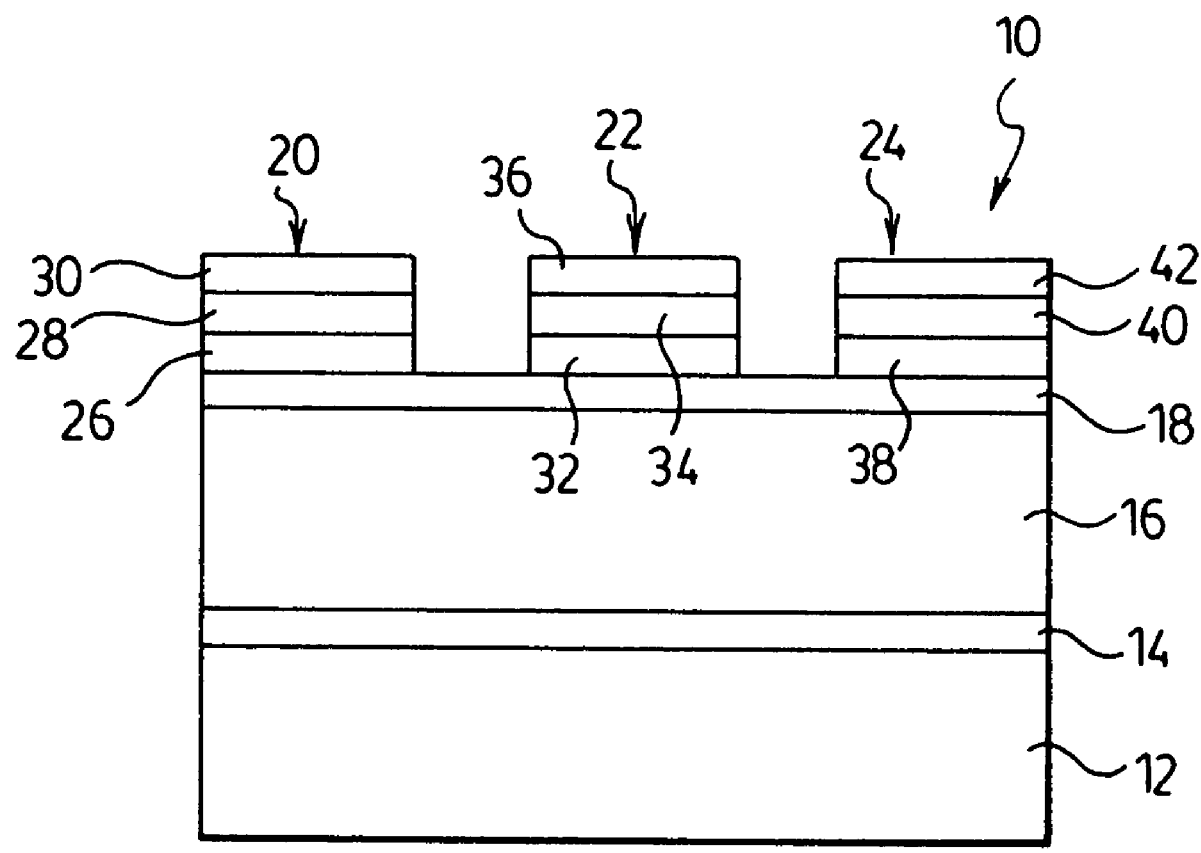

HYDROGEN SULFIDE INJECTION METHOD FOR PHOSPHOR DEPOSITION

This application claims the benefit of U.S. Provisional Application Ser. No. 60/484,290, filed Jul. 3, 2003.

FIELD OF THE INVENTION

The present invention relates to a method for the deposition of multi element sulfur-bearing thin film phosphor compositions. More specifically, the invention is a method for the deposition of a sulfur-bearing phosphor material where hydrogen sulfide is injected towards at least one of the deposition source materials that make up the deposited phosphor film. The method is particularly useful for the deposition of phosphors for full colour ac electroluminescent displays employing thick film dielectric layers with a high dielectric constant.

BACKGROUND OF THE INVENTION

Thick film dielectric electroluminescent devices as exemplified by U.S. Pat. No. 5,432,015 (the entirety of which is incorporated herein by reference) are typically fabricated on ceramic or glass substrates and provide superior resistance to dielectric breakdown, as well as a reduced operating voltage compared to thin film electroluminescent (TFEL) displays fabricated on glass substrates. The thick film dielectric layer of these devices have a high dielectric constant and provide a uniform pinhole-free insulating layer enabling reliable high electric field excitation of the visible-light emitting, red, green, and blue phosphor layers.

The Applicant has developed various methods for the deposition of phosphors used in thick film dielectric electroluminescent devices. For example, PCT CA01/01823. discloses a method, preferably using electron beam evaporation, for the deposition of a ternary, quaternary or similar phosphor composition, in which components of the composition are located on different sources. In particular, the compositions comprise thoaluminates, thiogallates or thioindates of elements from Group IIA and Group IIB of the Periodic Table of Elements, formed from these different sources. PCT CA01/01234 discloses a dual source phosphor deposition method using dual source electron beam deposition. The various compounds of the first and second sources are provided in the ratios required to provide the required composition of the phosphor. The deposited phosphors are preferably blue emitting europium activated barium thioaluminate.

The deposition of phosphor films comprising thioaluminates, thiogallates, or thioindates is a complex process. The properties of the deposited phosphor films are sensitive to background concentrations of sulfur and oxygen species present in the deposition atmosphere that may detrimentally affect film performance. Currently there is no reliable method to introduce hydrogen sulfide as a sulfur source for phosphor deposition at sufficiently high concentrations and sufficiently high reactive temperatures and energies in order to effectively and reproducibly provide a high luminance phosphor with stable operating characteristics. In some conventional electron beam evaporation methods, hydrogen sulfide is introduced into the deposition chamber through a feed tube to distribute itself uniformly within the chamber in a random manner. In other conventional deposition methods, the substrate is bombarded with hydrogen sulfide during deposition of the phosphor. However, these methods of hydrogen sulfide introduction do not fully overcome the tendency of the deposited phosphor to be unstable during operation.

There is therefore a need to provide a method for the deposition of a phosphor film in an electroluminescent display that introduces a sulfur source in a manner that obviates the problems associated with the prior art methods.

SUMMARY OF THE INVENTION

The present invention is a phosphor deposition method to deposit sulfur-bearing phosphor films by the targeted injection of a sulfur species, as a gas or vapour, directed onto one or more of the source materials used during vacuum deposition of the phosphor.

In particular, the method involves the targeted injection of a hydrogen sulfur gas or hydrogen sulfur vapour such that the hydrogen sulfide gas or hydrogen sulfur vapour is provided at a high concentration, suitable flow rate, high temperature and energy to cause decomposition of the hydrogen sulfide gas or vapour during the volatization of the source material(s) and deposition of the phosphor. The hydrogen sulfide gas or vapour is delivered towards the immediate vicinity of the source material(s) such that the partial pressure of the hydrogen sulfur gas or vapour in the vicinity of the source is at least two times higher than the general pressure in the deposition chamber during the film deposition. Targeted injection of hydrogen sulfur gas or vapour is done with the use of one or more injector tubes that direct and disperse the gas across the surface of the hot source material(s).

The method is particularly suitable for the deposition of phosphor compositions comprising thioaluminates, thiogallates or thioindates of elements from Group IIA and Group IIB of the Periodic Table of Elements, where the source material(s) include sulfides that contain at least some of the elements comprising the deposited phosphor films. The phosphors produced using the invention show increased stability and extended life as compared to phosphors made according to the methods of the prior art.

The injection of hydrogen sulfide directed at the one or more targets used in the method results in the deposition of a phosphor film composition with larger grains compared with grains of a phosphor film composition deposited in a method without the targeted injection of hydrogen sulfide. In aspects, the grains may be approximately equiaxed and extend substantially across the thickness of the deposited film about 9 to 0.5 µm whereas without targeted hydrogen sulfide injection, the grains are substantially smaller with an indication that the composition is more heterogeneous leading to a less stable phosphor.

The method of the invention is particularly useful for the deposition of phosphors for full colour ac electroluminescent displays employing thick film dielectric layers with a high dielectric constant.

According to an aspect of the invention is a method of vacuum evaporation of a multi-element sulfur bearing thin film composition onto a substrate, the method comprising;

within a deposition chamber, providing a source of gas or vapour sulfur species targeted at one or more source materials that make up at least part of the thin film composition during evaporation of the one or more source materials, wherein said gas or vapour sulfur species is heated to a high temperature as it reaches the one or more source materials and there is a chemical interaction of the gas or vapour sulfur-species with evaporant from said one or more source materials during deposition of said thin film composition.

According to an aspect of the invention is a method for the deposition of a a multi-element sulfur bearing thin film phosphor composition, the method comprising;

directing a flow of hydrogen sulfide gas at one or more source materials used to make up part of the phosphor composition during evaporation of the one or more source materials, wherein the hydrogen sulfide is heated to elevated temperatures present at the one or more source materials and said hydrogen sulfide gas is provided at substantially elevated pressure and at a suitable flow rate.

According to another aspect of the invention is a method for the deposition of a thin film of a pre-determined composition onto a substrate, the thin film comprising ternary, quaternary or higher sulfide compounds selected from the group consisting of thioaluminates, thiogallates and thioindates of at least one element from Groups IIA and IIB of the Periodic Table, the method comprising:

a) volatizing at least one source material comprising a sulfide that forms said pre-determined composition to form a sulfur-bearing thin film composition on a substrate; and b) during step a) injecting hydrogen sulfide gas or vapour at said at least one source material.

According to another aspect of the present invention, there is provided a method for the deposition of a thin phosphor film of a pre-determined composition onto a substrate, said composition comprising a ternary, quaternary or higher sulfide compounds selected from the group comprising thioaluminates, thiogallates and thioindates of at least one element from Groups IIA and IIB of the Periodic Table of Elements, the method comprising:

volatizing by electron beam evaporation, at least one source comprising a sulfide that forms said pre-determined composition onto a substrate; wherein during said volatizing a hydrogen sulfide gas or hydrogen sulfide vapour is injected and targeted at said at least one source such that substantially all of the hydrogen sulfide gas or hydrogen sulfide vapour is heated in the vicinity of the at least one source to a temperature sufficient to cause decomposition of the hydrogen sulfide gas or hydrogen sulfide vapour such that a requisite quantity of sulfur is deposited in the thin phosphor film.

In embodiments of the invention, the method is used to deposit a europium activated barium thioaluminate phosphor film and as such, aluminum sulfide and/or barium sulfide are used as at least one of the evaporation sources.

In further preferred embodiments the hydrogen sulfide gas or vapour is targeted at one or more of the evaporation sources, herein referred to as a source material, provided through one or more injection tubes that are directed towards the evaporation source material.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the detailed description given herein and from the accompanying drawings, which are given by way of illustration only and do not limit the intended scope of the invention.

FIG. 2 is shows a cross section of a thick film dielectric electroluminescent device having an europium activated barium thioaluminate phosphor deposited according to the method of the present invention.

DETAILED DESCRIPTION OF THE INVENTION

Figure 1A:
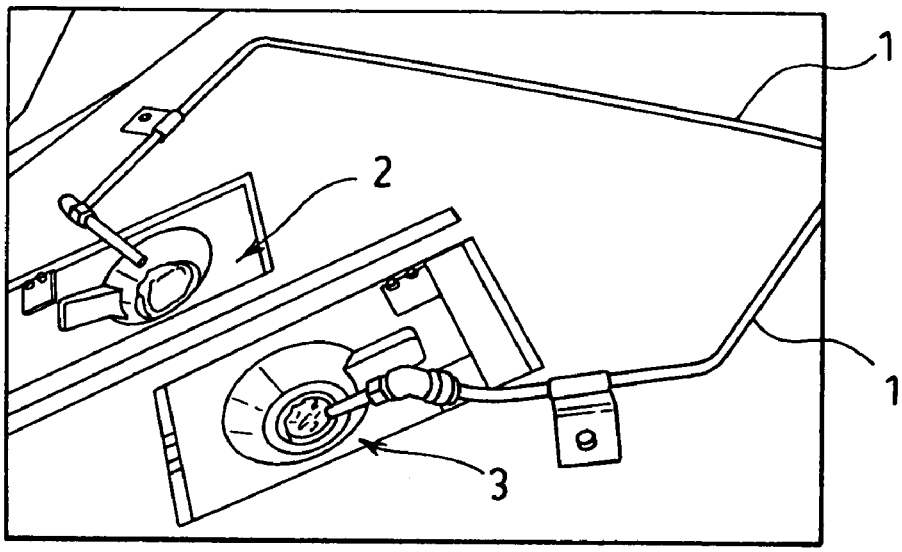
FIGS. 1A, 1B and 1C are photographs showing hydrogen sulfide injectors surrounding an electron beam source material. The hydrogen sulfide injectors are used to inject hydrogen sulfide towards the surface of the source material.

The present invention is a method for depositing multi-element sulfur bearing thin film compositions. In the method the introduction of sulfur species is targeted at the source material(s) during the deposition of thin film phosphor compositions which may be selected from the group consisting of thioaluminates, thiogallates, and thioindates of at least one element from Groups IIA and IIB of the Periodic Table of Elements.

The method for thin film phosphor deposition is a vacuum evaporation method which involves the targeted injection of sulfur species (i.e. sulfur bearing gases or vapours) towards one or more source materials provided in the deposition chamber, the one or more source materials provided are those that are used to make up at least part of the deposited phosphor composition. As such, the method is applicable to both single, dual and multi-source deposition of phosphor compositions. The preferred deposition method is electron beam evaporation.

The method of the invention is particularly useful for the deposition of an europium activated barium thioaluminate phosphor that has an increased stability and longer life in an electroluminescent device as compared to that of a similar device incorporating a phosphor that has not been deposited in accordance with the use of the present improved vacuum evaporation method that incorporates injection of the hydrogen sulfide gas or vapour at a source material. Deposition of the phosphor is particularly desired in an electroluminescent device comprising a thick film dielectric.

Suitable sulfur species represented as sulfur bearing gases for use in the method of the invention include but are not limited to hydrogen sulfide, elemental sulfur vapours (i.e. $S$, $S_2$, $S_3$, $S_4$, $S_5$, $S_6$, $S_7$ and $S_8$), carbon disulfide and various organic sulfur-bearing vapours such as dimethyl sulfoxide that do not contain elements or species detrimental to the deposition process. In preferred aspects, the gas is hydrogen sulfide.

The present invention overcomes the limitations inherent in the prior art by providing a means for achieving a high pressure of a hydrogen sulfide gas near the source material(s) used without having a high concentration of hydrogen sulfide throughout the deposition chamber. According to prior art methods, the hydrogen sulfide pressure is uniform or varies randomly throughout the deposition chamber. The present invention provides for a direct means to control the hydrogen sulfide flow rate at the deposition source(s). By avoidance of a high pressure of hydrogen sulfide throughout the deposition chamber the ability to pump the chamber is improved, and the amount of hydrogen sulfide required (a hazardous gas) to provide deposition is reduced thus reducing the requirements for scrubbing the off-gas from the process.

In the method of the invention, the flow rate of the hydrogen sulfide directed at the source material(s) is controlled. The flow rate is related to the local partial pressure which is increased compared to the general pressure in the deposition chamber during deposition. The flow rate for the hydrogen sulfide is effected by using an injector tube or tubes that disperses the hydrogen sulfide gas across the surface of the source material(s) used for the deposition. The hydrogen sulfide gas as targeted onto the source material(s) is also heated to very high temperatures as it reaches the heated source materials. The hydrogen gas is not pre-heated but rather is heated following injection due to the proximity of the hot source material(s). Therefore, the hydrogen sulfide gas will approximately reach the temperatures of the heated source material(s). The temperature of the hydrogen gas need not be directly controlled.

Suitable flow rates for the hydrogen sulfide gas are above 5 sccm and more preferably in the range of about 20 to 60 sccm including any ranges between 20 to 60 sccm. The optimal flow rate is dependent on the size and evaporation rate of the source material(s) and the size and pumping capacity of the vacuum deposition system as is understood by one of skill in the art.

The flow rate of hydrogen sulfide directed at the source materials is controlled using a gas flow controller that meters out the hydrogen gas from a gas line originating from a compressed or liquefied hydrogen sulfide source. A high vacuum pump is used to balance the gas flow rate with the background pressure in the chamber. The pumping rate of the high vacuum pump can be controlled with a throttle valve that changes the orifice size of the opening to the high vacuum pump to adjust the chamber pressure to the desired value. A gettering or condensing material may be provided substantially adjacent to the source material(s) in order to remove any unwanted or excess sulfur bearing species from the chamber before they impinge on the deposition substrate and thus become incorporated into the deposited phosphor composition. The deposition is conducted with the deposition substrate at a temperature sufficiently low to prevent re-evaporation of the condensed sulfur bearing species from the deposition substrate as is understood by one of skill in the art.

At the point of injection the hydrogen sulfide gas is at the highest partial pressure and continues to be at a high partial pressure relative to the pressure in the deposition chamber during deposition of the phosphor in the vicinity of the deposition source materials at which the gas or vapour is directed; The gas or vapour is heated to a high temperature in this region due to the intense heat of either the electron beam or plasma used. The temperature of the gas or vapour may reach in the range of about several thousand degrees celsius.

The method directs hydrogen sulfide gas onto the source materials used that make up the phosphor composition and not on the deposition substrate. The injection of the gas is done by using a gas delivery tube pointed directly at the hot source(s). The end of the gas delivery tube is approximately 3 cm from the source(s) and directs hydrogen sulfide flow from an oblique angle so that the tube does not shadow the flux of evaporant from the source(s). As is understood by one of skill in the art, the distance between the end of the gas delivery tube and the source material(s) should be such that substantially all of the injected hydrogen sulfide impinges directly on the source(s) and thus may vary.

It is understood by one of skill in the art that the gas delivery tube and dispersal apparatus should be of a sufficient size and adequate configuration to provide a concentrated blanket of hydrogen sulfide gas that is localized over each separate source material as required. If more gas delivery is needed to fully cover the source then additional tubes can be placed at each source such that a single source may have more than one tube. The gas delivery tube can be fabricated from a suitable unreactive material such as stainless steel or an alloy of stainless steel or monel such that the hydrogen sulfide or a related species will not react with the delivery tube. However, the end of the gas delivery tube that is close to the source material, must be fabricated from a refractory material such as alumina since to withstand high temperatures due to its proximity to the hot source material.

In the method it is understood by one of skill in the art that any number of gas injector tubes may be used to target the injection of hydrogen sulfide gas at one or more source materials. The injected hydrogen sulfide gas may also partially remove any oxygen that may be present as a contaminant in the source materials or as a constituent of the deposition atmosphere. The injected hydrogen sulfide gas combines with any oxygen to create oxides of sulfur or water that can be condensed from the deposition chamber by the use of a getter or cold trap such as that described in Applicant's co-pending U.S. Provisional Application 60/443,540 filed Jan. 30, 2003 (the entirety of which is incorporated herein by reference).

Substantially all of the hydrogen sulfide gas entering the deposition chamber is directed to pass through the plasma emitted from the source material(s) used. The magnetic fields associated with the electron beam will tend to deflect any ions generated as a result of the gas injection back onto the source material(s) leaving neutral species to emanate from the vicinity of the source to impinge on the deposition substrate. The method achieves a fast rate of response for process control since the control point for hydrogen sulfide gas or vapour flow is right at the reaction site, i.e. the source material(s). It also suppresses decomposition of hydrogen sulfide at the deposition substrate, thus minimizing diffusion of atomic hydrogen from the hydrogen sulfide gas or vapour into and reaction with the deposited phosphor and/or substrate.

Decomposition of the hydrogen sulfide into atomic species and subsequent reaction with other atomic species present in the deposition chamber may be facilitated by the plasma generated by the source electron beam in the vicinity of the source material. The nature of these reactions can be controlled by varying the electron beam power applied to the source, by controlling the raster configuration and raster rate of the electron beam over the source material, by controlling the pumping rate into the deposition chamber and by controlling the flow rate and dispersal of the hydrogen sulfide gas or vapour over the source. The various chemical species in the vicinity of the source material may react to form a near-equilibrium population of species at a characteristic temperature that can be controlled by changing the process variables listed above. The population of these species will in turn affect the nature of the deposited phosphor film, and thus the film can be optimized and controlled by adjusting the process variables listed above.

The method of the present invention may be effected from a single source material or from multiple source materials, so long as the selected single source or multiple sources form the predetermined composition on the substrate are volatilized using vacuum methods such as electron beam evaporation. The preferred method is electron beam deposition. The temporal variation of deposition of the components onto the substrate from the source materials(s) used that form the deposited phosphor composition is monitored and controlled to effect simultaneous vapour deposition from the source material(s) as taught in Applicant's co-pending PCT CA 01/01823 (the entirety of which is hereby incorporated by reference).

Figure 1B:
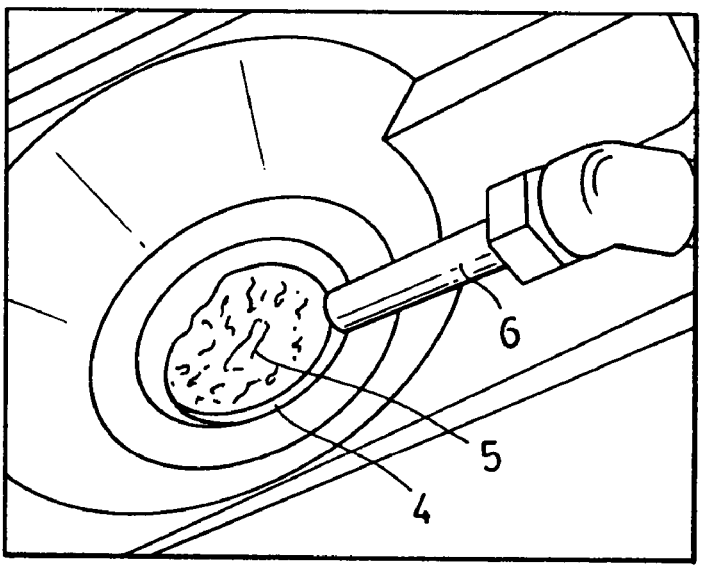

The present invention is further illustrated by an embodiment shown in FIG. 1A that shows hydrogen sulfide injector tubes 1 running to an $Al_2S_3$ source material 2 and a BaS:Eu source material 3. FIG. 1B shows detail of the BaS:Eu containing crucible 4 showing the hot surface of BaS:Eu 5 and the alumina end-tube on the injector 6 that blows the hydrogen sulfide directly on the surface of the source. The top edge of the crucible is visible as the crucible sits down within the electron beam evaporator hearth. During electron beam evaporation an intense electron beam scans the crucible's contents at the top surface. The electron beam causes the contents to heat up to high temperatures and begin to evaporate the source material. The gas from the injector impinges upon this hot surface while evaporant and the electron beam scans in the stream of the injected hydrogen sulfide. This heats and ionized the gas, with ions directed by the magnetic field associated with the electron beam towards the source, leaving neutral atomic and molecular species to migrate towards the deposition substrate located above the BaS:Eu and $Al_2S_3$ containing crucibles.

Figure 1C:
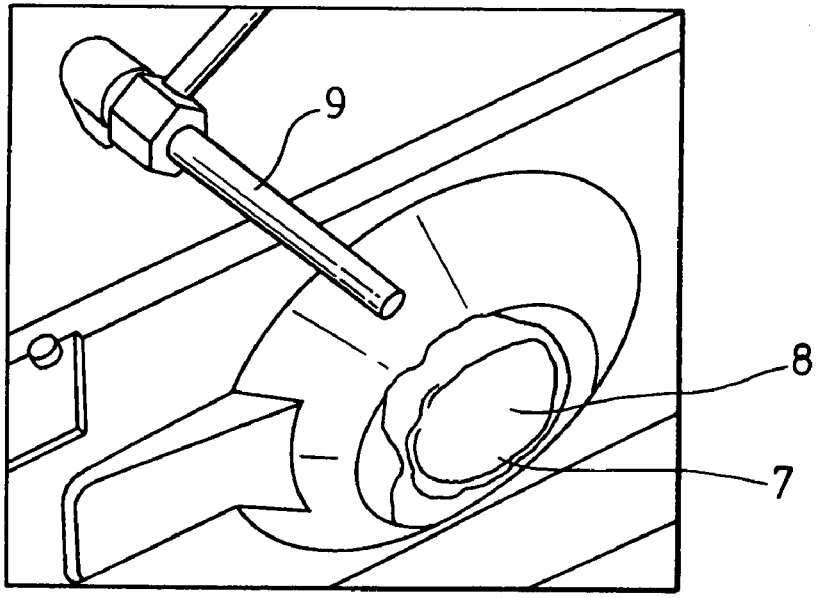

FIG. 1C shows the $Al_2S_3$ containing crucible 7 in the preferred embodiment having the injector spray aimed down at the surface of the hot $Al_2S_3$. As with the BaS:Eu, the hot surface of the $Al_2S_3$ 8 is bathed in hydrogen sulfide gas from the injector end-tube 9 with the evaporant emanating from the crucible surface towards the substrate to be coated and passing through the hydrogen sulfide gas from the injector, possibly causing thermalization of the gas mixture. The electron beam itself also scans through the hydrogen sulfide from the injector, heating and ionizing the gas. The magnetic field associated with the electron beam causes ions in the vicinity to be directed towards the source, leaving neutral atomic molecular species to migrate towards the deposition substrate located above the BaS:Eu and $Al_2S_3$ containing sources.

The present invention is useful for the deposition of a sulfur bearing phosphor composition in a thick film dielectric electroluminescent device shown in cross-section in FIG. 2. The device, generally indicated by 10, has a base substrate 12 on which is located row electrode 14. Thick film dielectric 16 has thin film dielectric 18, thereon. Thin film dielectric 18 is shown with three pixel columns, referred to as 20, 22, and 24, located thereon. The pixel columns contain sulfur bearing phosphors to provide the three basic colours viz. red, green and blue. Pixel column 20 has red phosphor 26 located in contact with thin film dielectric 18. Another thin film dielectric 28 is located on red phosphor 26, and column electrode 30 is located on thin film dielectric 28. Similarly, pixel column 22 has green phosphor 32 on thin film dielectric 28. Similarly, pixel column 22 has green phosphor 32 on thin film dielectric 18, with the thin film dielectric 34 and column electrode 36 thereon. Pixel column 24 has blue phosphor comprising europium activated barium thioialuminate 38 on thin film dielectric 18, with thin film dielectric 40 and column electrode 42 thereon.

Figure 3:
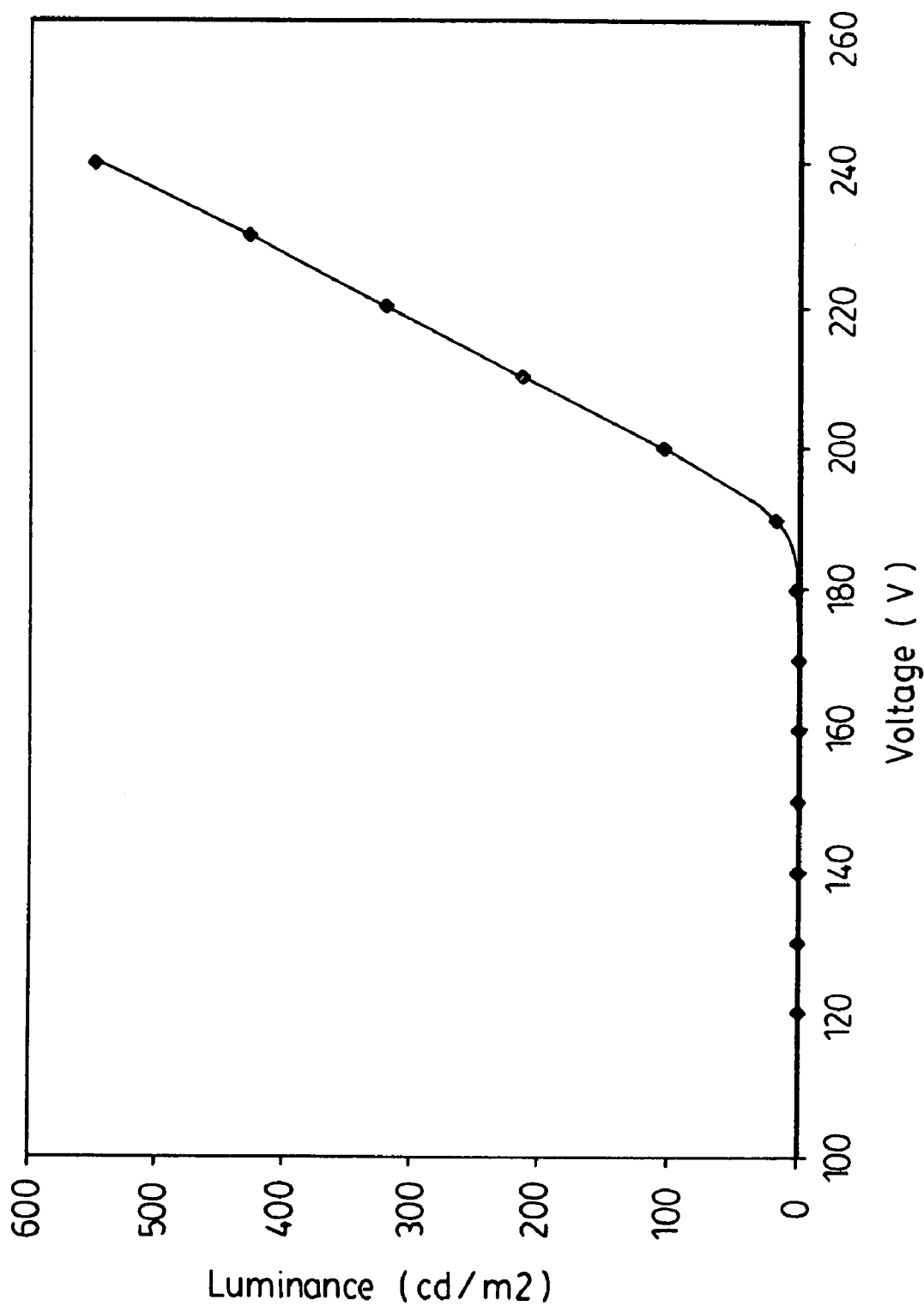
FIG. 3 is a graph illustrating the luminosity versus applied voltage of a thick film dielectric electroluminescent device having a europium activated barium thioaluminate phosphor deposited according to the method of the present invention.

With this structure, light is emitted as an alternating current voltage is applied across the film stack as shown by example in FIG. 3. The display is viewed from the column electrode side of the display and the display emits light once the applied voltage exceeds a threshold voltage. The display becomes brighter as the voltage increases. Over time the luminance of the display may decrease even though the voltage remains constant. This luminance decline defines the lifetime of the display, with a decrease to half luminance ordinarily defined as the life of the display. The key result of the present invention is to extend the life of the display by decreasing the rate of this decline with operating time for a constant applied voltage.

Stoichiometry of the deposited phosphor compositions may be controlled as disclosed in the Applicant's co-pending PCT CA01/01823 (the disclosure of which is incorporated herein by reference in its entirety). Control of stoichiometry during deposition is effected using two or more deposition source materials with different chemical compositions, together with a deposition rate measuring. system for the source materials that measures the deposition rate for the sources independently from each other and a feedback system that controls the relative deposition rates commensurate with the measured rates.

In summary, the present invention provides a method for the deposition of a thin film phosphor comprising a rare earth activated thioaluminate or related phases achieving high energy efficiency and high luminosity. The method can be used to deposit phosphors in the form of ternary or quaternary compounds keeping the ratio of the three or four, or more, constituent elements controlled to close tolerances to achieve optimum phosphor performance and to reduce the likelihood that the phosphor material may form into more than one crystal phase. Furthermore, the method is such to ensure that the concentration of impurities such as oxygen are kept to a minimum.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

A thick film dielectric electroluminescent device was constructed incorporating thin film phosphor layers of barium thioaluminate activated with europium. The thick film substrate was a 5 cm×5 cm glass substrate having a thickness of about 2 mm. Onto this substrate was deposited a gold electrode, followed with a thick film high dielectric constant dielectric layer in accordance with the methods exemplified in Applicant's co-pending Provisional patent application Ser. No. 10/326,777 filed Dec. 19, 2002 (the disclosure of which is incoporated herein by reference in its entirety). A 100 nm to 200 nm thin film dielectric layer of barium titanate was deposited on top of the thick film dielectric layer using the sol gel technique described in Applicant's co-pending U.S. patent application Ser. No. 09/761,971 filed Jan. 17, 2001 (the disclosure of which is herein incorporated in its entirety).

A 600 nm thick barium thioaluminate phosphor film activated with about 3 atomic percent of europium with respect to barium was electron beam deposited onto the barium titanate layer according to the methods of Applicant's co-pending International Patent Application PCT CA01/01823 (the disclosure of which is herein incorporated in its entirety).

A cold trap was located adjacent to the barium sulfide and aluminum sulfide sources in accordance with the methods exemplified in Applicant's co-pending U.S. Provisional Patent Application 60/443,540 filed Jan. 30, 2003 (the disclosure of which is herein incorporated in its entirety) to condense excess sulfur, oxygen, and other volatile impurities. Following deposition the deposited phosphor was annealed under nitrogen in a belt furnace with a peak temperature of 700° C. to about 750° C. for about one minute. A 50 nm thick aluminum nitride layer was then sputter-deposited onto the phosphor layer followed by deposition of an indium tin oxide upper conductor film according to the methods of Applicant's co-pending International Patent Application PCT CA00/00561 (the disclosure of which is herein incorporated in its entirety). The completed device was annealed in air at about 550° C. and then annealed under nitrogen at about 550° C. following deposition of the indium tin oxide and prior to testing.

Figure 4:
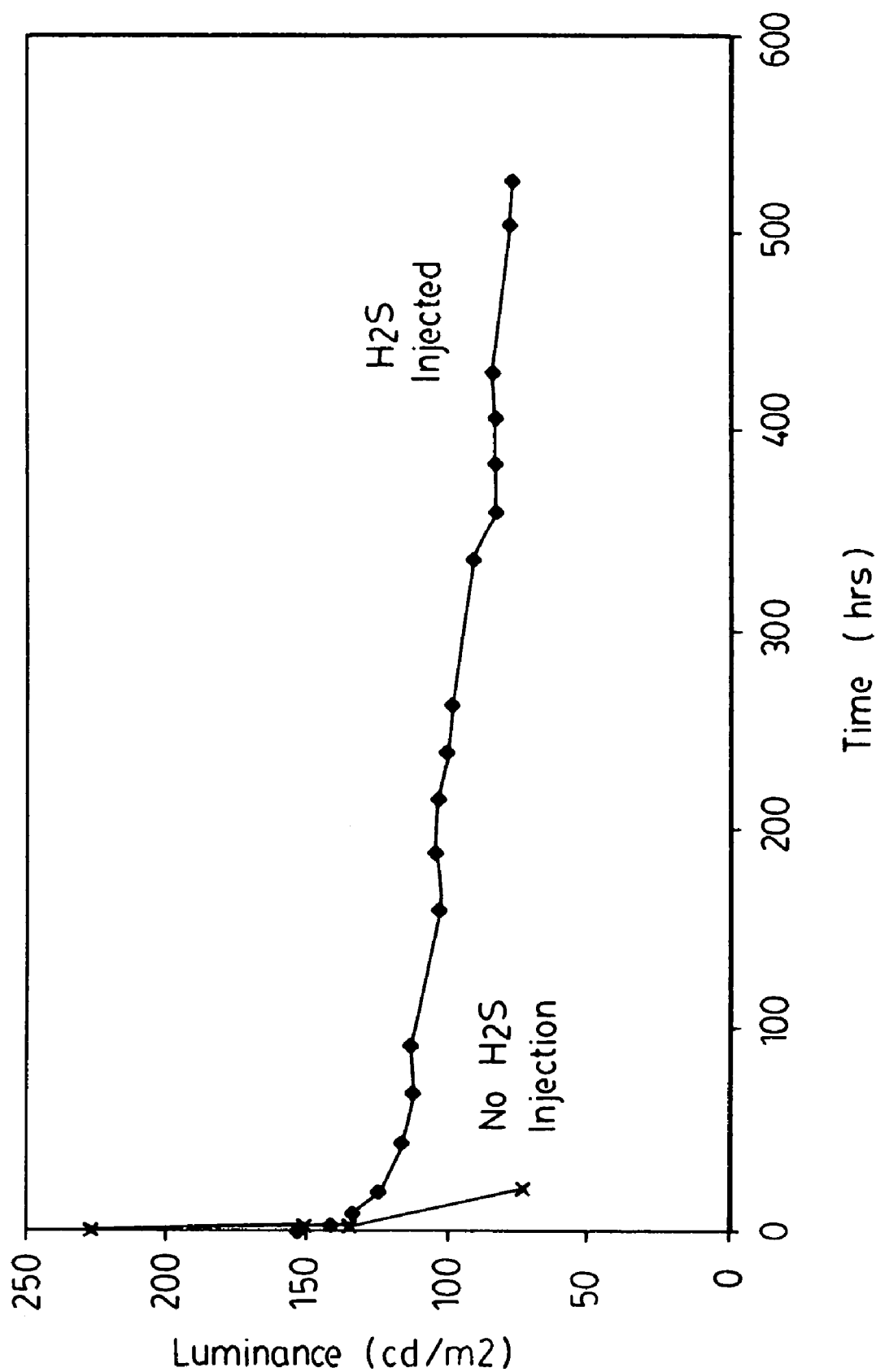
FIG. 4 is a graph illustrating the luminance versus operating time for two devices. The first device is a thick film dielectric electroluminescent device having a europium activated barium thiolauminate phosphor deposited according to the method of the present invention and subsequently annealed under nitrogen. The second device is similar to that of the first except that it was made in accordance with a deposition method that did not employ hydrogen sulfide injection at the deposition source.

The device was tested by applying a 240 Hz alternating polarity square wave voltage waveform with a pulse width of 30 nanoseconds and an amplitude of 60 volts about the optical threshold voltage. FIG. 3 shows the typical luminance as a function of applied voltage for the device. As can be seen from the data, the luminance at 60 volts above the threshold voltage of 190 was about 475 candelas per square meter. FIG. 4 shows the typical life of the device expressed as luminance versus operating time. The curve indicated by "no $H_2S$ injection" shows the life of a phosphor made without the injection of $H_2S$ at the source and demonstrates that the brightness falls to half the intensity in less than 10 hrs.

The phosphor film was analyzed by energy dispersive X-ray analysis to determine concentrations of elemental species in the phosphor film. The result demonstrated an aluminum to barium ratio of about 3 to 3 with the film containing about 8.3 atomic percent oxygen and about 43 atomic percent sulfur.

Example 2

A device similar to that of Example 1 was constructed but incorporated the hydrogen sulfide injector of the present invention as shown in FIG. 1. The injector was used to provide a controlled concentrated source of hydrogen sulfide gas at a rate of 20 to about 60 sccm on the surface of the molten sulfide sources and in the environment of the electron beam. FIG. 4 shows the typical life of the device expressed as luminance versus operating time. The curve indicated by "$H_2S$ injected" shows a dramatic increase in lifetime to more than 500 hours for such the device compared to the lifetime of a device fabricated in accordance with Example 1.

The phosphor film was analyzed by energy dispersive X-ray analysis to determine concentrations of elemental species in the phosphor film. The film had an aluminum to barium ratio of about 3 to 7 with the film containing about 9.9 atomic percent oxygen and 41 atomic percent sulfur. The use of the hydrogen sulfide injector increased the operational lifetime of the deposited phosphor but did not substantially change the sulfur content of the film.

Example 3

Figure 5:
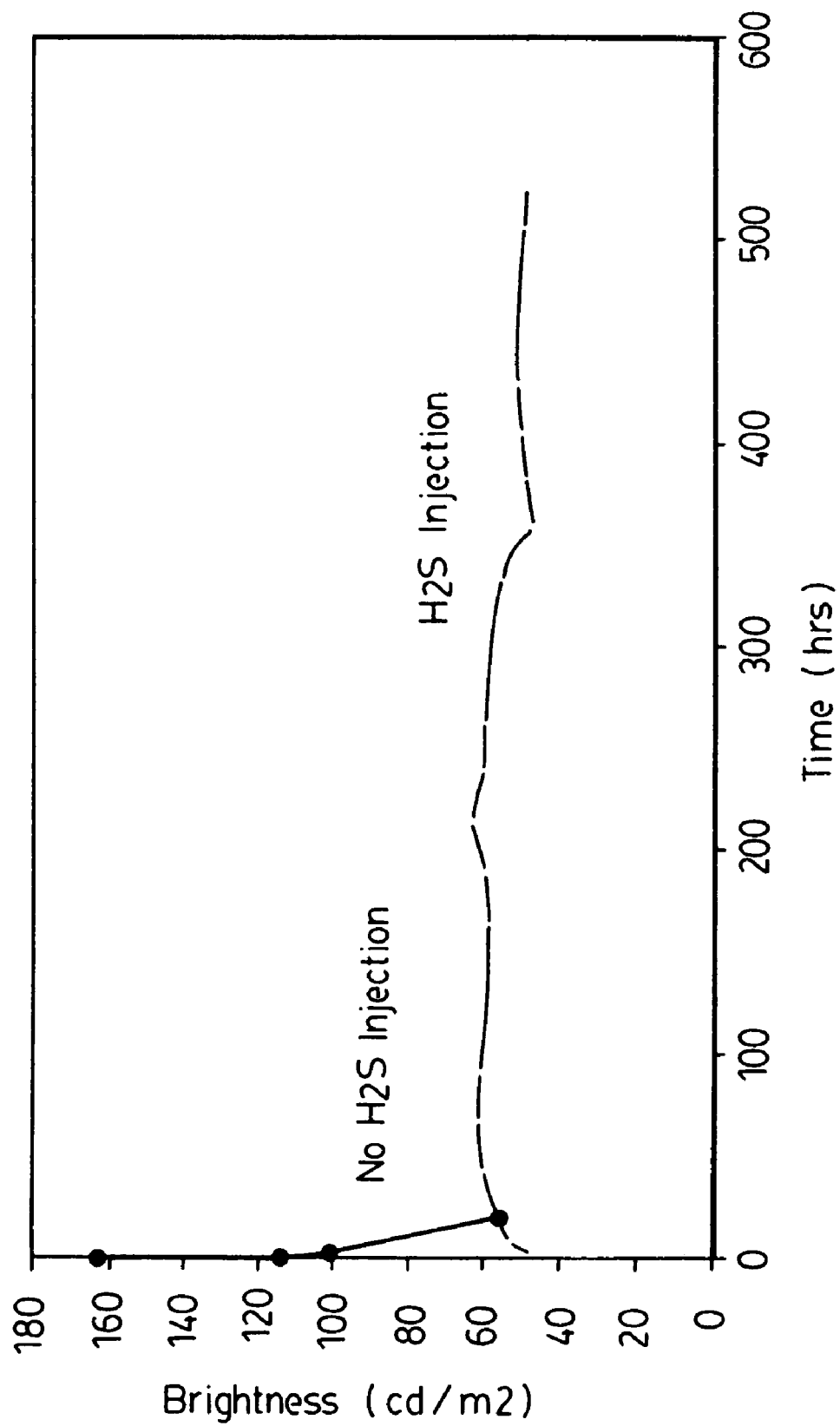
FIG. 5 is a graph illustrating the luminance versus operating time for two devices. The first device is a thick film dielectric electroluminescent device having a europium activated barium thioaluminate phosphor deposited in accordance with the method of the present invention and annealed subsequently in air. The second device is similar to that of the first except that it was made in accordance with a deposition method that did not employ hydrogen sulfide injection at the deposition source.

A device similar to that of Example 1 was constructed but instead of annealing the device in nitrogen immediately following phosphor deposition the device was annealed in air. FIG. 5 shows the operation lifetime for such a device expressed as luminance versus operating time. The curve marked "no $H_2S$ injector" shows that the operational life, defined as time to half brightness, was about 10 hrs.

Example 4

A device similar to that of Example 3 was constructed but using the method of the present invention with the hydrogen sulfide injector shown in FIG. 1. FIG. 5 shows the operation lifetime for such a device expressed as luminance versus operating time. The curve in the figure marked "$H_2S$ injected" shows that while brightness is initially lower than the devices of Example 1 and Example 2, the operational life is again dramatically increased.

Examples 1, 2, 3, and 4 demonstrate that a dramatic increase in operational life is achieved with the use of the hydrogen sulfide injector method of the present invention regardless of whether the phosphor is annealed in air or nitrogen following deposition of the phosphor. The results also demonstrate that the benefit is realized without any increase in the sulfur content of the deposited phosphor film.

Although preferred embodiments of the invention have been described herein in detail, it will be understood by those skilled in the art that variations may be made thereto without departing from the spirit of the invention or the scope of the appended claims.

The invention claimed is:

1. A method of vacuum evaporation of a multi-element sulfur bearing thin film composition onto a substrate, the method comprising;

within a deposition chamber, providing a source of gas or vapour sulfur species targeted at one or more source materials that make up at least part of the thin film composition during evaporation of the one or more source materials, wherein said gas or vapour sulfur species is provided at a flow rate directed at the source materials to disperse the gas or vapour sulfur species across the surface of the source materials at a higher partial pressure compared to the pressure throughout said deposition chamber, and wherein there is a chemical interaction of the gas or vapour sulfur species with evaporant from said one or more source materials during deposition of said thin film composition.

2. The method of claim 1, wherein said gas or vapour sulfur species is selected from the group consisting of hydrogen sulfide, elemental sulfur vapour, carbon disulfide, organic sulfur-bearing vapour and mixtures thereof.

3. The method of claim 2, wherein said elemental sulfur vapour is selected from the group consisting of S, $S_2$, $S_3$, $S_4$, $S_5$, $S_6$, $S_7$ and $S_8$.

4. The method of claim 2, wherein said organic sulfur-bearing vapour is dimethyl sulfoxide.

5. The method of claim 2, wherein said gas or vapour sulfur species is hydrogen sulfide.

6. The method of claim 2, wherein said gas or vapour sulfur species is provided at a flow rate of about 5 sccm to about 60 sccm.

7. The method of claim 6, wherein said flow rate is about 20 sccm to about 60 sccm.

8. The method of claim 6, wherein said gas or vapour sulfur species is controlled using a gas flow controller.

9. The method of claim 2, wherein said gas or vapour sulfur species is targeted using a gas delivery tube pointed at said one or more source materials.

10. The method of claim 9, wherein said gas delivery tube is approximately 3 cm from said one or more source materials.

11. The method of claim 2, wherein said gas or vapour sulfur species is provided at a high temperature that is substantially equal to temperatures of said source materials.

12. The method of claim 1, wherein said method is an electron beam evaporation method.

13. The method of claim 12, wherein said multi-element sulfur bearing thin film composition is a thioaluminate, thiogallate or thioindate of at least one element from Groups IIA and IIB of the Periodic Table of Elements.

14. The method of claim 13, wherein said multi-element sulfur bearing thin film composition is a europium activated barium thioaluminate.

15. The method of claim 14, wherein said one or more source materials is selected from aluminum sulfide and/or barium sulfide.

16. The method of claim 15, wherein said one or more source materials is aluminum sulfide.

17. A method for the deposition of a thin film of a pre-determined composition onto a substrate within a deposition chamber, the thin film comprising ternary, quaternary or higher sulfide compounds selected from the group consisting of thioaluminates, thiogallates and thioindates of at least one element from Groups IIA and IIB of the Periodic Table, the method comprising:
   a) volatizing at least one source material comprising a sulfide that forms said pre-determined composition to form a sulfur-bearing thin film composition on a substrate; and
   b) during step a) injecting a gas or vapour sulfur species at said at least one source material
   wherein said gas or vapour sulfur species are provided at a flow rate directed at the at least one source material to disperse the gas or vapour sulfur species across the surface of the at least one source material at a high partial pressure compared to the pressure throughout said deposition chamber, and wherein there is a chemical interaction of the gas or vapour sulfur species with evaporant from said at least one source material during deposition of said thin film composition.

18. The method of claim 17, wherein said gas or vapour sulfur species is selected from the group consisting of hydrogen sulfide, elemental sulfur vapour, carbon disulfide, organic sulfur-bearing vapour and mixtures thereof.

19. The method of claim 18, wherein said elemental sulfur vapour is selected from the group consisting of S, $S_2$, $S_3$, $S_4$, $S_5$, $S_6$, $S_7$ and $S_8$.

20. The method of claim 19, wherein said organic sulfur-bearing vapour is dimethyl sulfoxide.

21. The method of claim 18, wherein said gas or vapour sulfur species is hydrogen sulfide.

22. The method of claim 18, wherein said gas or vapour sulfur species is injected at a flow rate of about 5 sccm to about 60 sccm.

23. The method of claim 22, wherein said flow rate is about 20 sccm to about 60 sccm.

24. The method of claim 22, wherein said flow rate of said gas or vapour sulfur species is controlled using a gas flow controller.

25. The method of claim 18, wherein said gas or vapour sulfur species is injected using a gas delivery tube pointed at said one or more source materials.

26. The method of claim 25, wherein said gas delivery tube is approximately 3 cm from said one or more source materials.

27. The method of claim 18, wherein said gas or vapour sulfur species is heated to substantially equal temperatures to said at least one source material.

28. The method of claim 18, wherein said method is an electron beam evaporation method.

29. The method of claim 28, wherein said multi-element sulfur bearing thin film composition is a europium activated barium thioaluminate.

30. The method of claim 18, wherein said at least one source material is selected from aluminum sulfide and barium sulfide.

31. The method of claim 30, wherein said at least one source material is aluminum sulfide.

* * * * *